US009843022B2

United States Patent
Nakamura et al.

(10) Patent No.: US 9,843,022 B2
(45) Date of Patent: Dec. 12, 2017

(54) ORGANIC LIGHT EMITTING DEVICE AND ELECTRONIC APPARATUS

(71) Applicant: SEIKO EPSON CORPORATION, Tokyo (JP)

(72) Inventors: Hisatoshi Nakamura, Tasuno-machi (JP); Shinichi Iwata, Chino (JP); Takefumi Fukagawa, Fujimi-machi (JP); Tsutomu Asakawa, Shiojiri (JP); Yuki Hanamura, Azumino (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 15/216,785

(22) Filed: Jul. 22, 2016

(65) Prior Publication Data
US 2017/0092896 A1    Mar. 30, 2017

(30) Foreign Application Priority Data
Sep. 28, 2015   (JP) ................................ 2015-190229

(51) Int. Cl.
*H01L 51/52*    (2006.01)
*H01L 27/32*    (2006.01)

(52) U.S. Cl.
CPC ...... *H01L 51/5256* (2013.01); *H01L 27/3211* (2013.01); *H01L 27/3244* (2013.01); *H01L 51/525* (2013.01); *H01L 51/5246* (2013.01); *H01L 51/5253* (2013.01); *H01L 2251/301* (2013.01); *H01L 2251/303* (2013.01)

(58) Field of Classification Search
CPC ................. H01L 51/52; H01L 51/5256; H01L 2251/301; H01L 2251/303; H01L 27/3211; H01L 27/3244; H01L 51/5246; H01L 51/525; H01L 51/5253
See application file for complete search history.

(56) References Cited

U.S. PATENT DOCUMENTS

| | | | |
|---|---|---|---|
| 9,246,305 B1* | 1/2016 | Kub .................... H01S 5/02484 |
| 2006/0088951 A1 | 4/2006 | Hayashi et al. | |
| 2007/0132381 A1 | 6/2007 | Hayashi et al. | |
| 2009/0115321 A1* | 5/2009 | Hayashi ............. H01L 51/5253 313/504 |

FOREIGN PATENT DOCUMENTS

| | | |
|---|---|---|
| JP | 2006-147528 A | 6/2006 |
| JP | 2006-192825 A | 7/2006 |
| JP | 2007-157606 A | 6/2007 |
| JP | 2008-181828 A | 8/2008 |

* cited by examiner

*Primary Examiner* — Thanh T Nguyen
(74) *Attorney, Agent, or Firm* — Oliff PLC (57) ABSTRACT

An organic light emitting device has a substrate, an organic light emitting element disposed on the substrate, and a sealing layer sealing the organic light emitting element by covering the organic light emitting element. The sealing layer is a multilayer body in which a first sealing layer mainly containing an inorganic material, a buffer layer mainly containing a resin material, and a second sealing layer mainly containing silicon oxynitride are successively stacked from a side of the organic light emitting element. The first sealing layer has a heavy hydrogen diffusion coefficient of $1.0 \times 10^{-21}$ m$^2$/sec or more at 85° C. in a heavy hydrogen atmosphere.

8 Claims, 7 Drawing Sheets

ORGANIC LIGHT EMITTING DEVICE AND ELECTRONIC APPARATUS

BACKGROUND

1. Technical Field

The present invention relates to an organic light emitting device and an electronic apparatus.

2. Related Art

An organic electroluminescence element (organic EL element) is configured to have an anode, a cathode, and a functional layer containing an organic light emitting layer interposed between the electrodes. The functional layer emits fluorescence or phosphorescence through conversion of energy, which is produced in the organic light emitting layer by recombination of holes injected from the anode and electrons injected from the cathode.

However, when moisture, oxygen, and the like enter the functional layer through the anode or the cathode from the outside, the injection of carriers (holes and electrons) into the organic light emitting layer is suppressed, so that the luminance of light emission decreases or the functional layer deteriorates, and thus the light emission function itself is lost, which leads to the formation of non-light emitting areas called dark spots.

In an organic EL device (organic light emitting device) having such an organic EL element (organic light emitting element), sealing layers covering the organic EL element are formed to prevent moisture, oxygen, and the like from entering.

As the sealing layer, in JP-A-2006-147528, for example, a cathode protection layer containing an inorganic material, such as silicon oxynitride, a buffer layer (planarization layer) containing a resin material, such as epoxy resin, and a gas barrier layer containing an inorganic material, such as silicon oxynitride, are formed into a multilayer body having a three-layer structure in which these layers are stacked in this order from a cathode side.

In an organic EL device having the sealing layer of such a structure, both the cathode protection layer and the gas barrier layer contain inorganic materials, such as silicon oxynitride, and therefore not only the gas barrier layer but also the cathode protection layer sometimes exhibits gas barrier properties of preventing entry of moisture, oxygen, and the like as in the case of the gas barrier layer.

Therefore, when the cathode protection layer also exhibits the gas barrier properties, the two layers of the cathode protection layer and the gas barrier layer have the gas barrier properties in the sealing layer. Accordingly, the sealing layer exhibits excellent gas barrier properties as compared with a case where one gas barrier layer forms the sealing layer, for example.

Thus, when both the cathode protection layer and the gas barrier layer are caused to exhibit the gas barrier properties, it is considered that the generation of the dark spots is apparently prevented in the organic EL element, and thus the life characteristics of the organic EL device are improved.

However, in the cathode protection layer and the gas barrier layer of the above-described structure, there is a certain probability of a defective portion, in which the gas barrier properties locally decrease resulting from the mixing of foreign substances into the layers or a defect arising in the structure in the layers, being generated.

Then, in a case where the sealing layer is, for example, a single layer of gas barrier layer, when such a defective portion is generated in the gas barrier layer (sealing layer), moisture, oxygen, and the like immediately enter the functional layer from the defective portion, and, as a result, dark spots are generated. Therefore, the generation of dark spots is detected as an initial failure, so that a problem regarding the reliability of the organic light emitting device, that is, dark spots being generated during use after the organic light emitting device has been shipped, does not arise.

On the other hand, it is supposed that such defective portions are generated in both of the two layers of the sealing layer, namely, the cathode protection layer and the gas barrier layer having the gas barrier properties (in particular, it is supposed that such defective portions are generated at separate positions when viewed in plan). It takes a certain period of time for moisture, oxygen, and the like to enter the functional layer through the two defective portions. Therefore, the generation of dark spots is not detected as an initial failure, which has caused a problem in that dark spots are generated during use by a purchaser after the organic EL device has been shipped, and as a result, the reliability of the organic EL device decreases.

Accordingly, in the organic light emitting device having the sealing layer composed of two layers, that is, the cathode protection layer and the gas barrier layer with gas barrier properties, the manufacturing yield is improved but dark spots are generated at a relatively early stage after shipment, which has caused a problem in that the organic EL device is not sufficiently reliable during use.

SUMMARY

An advantage of some aspects of the invention is that an organic light emitting device having an organic light emitting element in which a reduction in light emission properties resulting from the generation of the dark spots is suppressed or prevented over a long period of time and an electronic apparatus that has high reliability and that has the organic light emitting device are provided.

The organic light emitting device and the electronic apparatus are achieved by the invention described below.

Application Example 1

An organic light emitting device according to an aspect of the invention has a substrate, an organic light emitting element disposed on the substrate, and a sealing layer sealing the organic light emitting element by covering the organic light emitting element, in which the sealing layer is a multilayer body in which a first sealing layer mainly containing an inorganic material, a buffer layer mainly containing a resin material, and a second sealing layer mainly containing silicon oxynitride are successively stacked from a side of the organic light emitting element, and the first sealing layer has a heavy hydrogen diffusion coefficient of $1.0 \times 10^{-21}$ m$^2$/sec or more in the layer at 85° C. in a heavy hydrogen atmosphere.

According to such an organic light emitting device, a reduction in light emission properties resulting from the generation of dark spots can be exactly suppressed or prevented in the organic light emitting element of the organic light emitting device.

Application Example 2

In the organic light emitting device according to an aspect of the invention, the inorganic material preferably contains at least one kind of silicon oxynitride, silicon oxide, and silicon nitride.

By the use of the substances described above, the heavy hydrogen diffusion coefficient in the first sealing layer can be easily set to $1.0 \times 10^{-21}$ m$^2$/sec or more.

Application Example 3

In the organic light emitting device according to an aspect of the invention, the inorganic material is silicon oxynitride, and, when transmittance of the first sealing layer is measured by a Fourier-transform infrared spectrophotometer and a transmittance at a peak appearing around 1000 cm$^{-1}$ is set to A [%] and a transmittance at a peak appearing around 3200 cm$^{-1}$ is set to B [%], B/A is preferably 0.6 or more.

Thus, the organic light emitting device according to an aspect of the invention can be configured so that the heavy hydrogen diffusion coefficient of the first sealing layer is set to $1.0 \times 10^{-21}$ m$^2$/sec or more.

Application Example 4

In the organic light emitting device according to an aspect of the invention, the second sealing layer preferably contains a layer in which the B/A is 0.01 or more and less than 0.5.

Thus, the second sealing layer can be made into a denser layer, and therefore the organic light emitting device can be configured so that the transmission of moisture (vapor) or oxygen is not certainly permitted.

Application Example 5

An electronic apparatus according to an aspect of the invention has the organic light emitting device according to an aspect of the invention.

Due to the fact that the organic light emitting device of such a structure is provided, the reliability of the electronic apparatus becomes high.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an organic light emitting device and an electronic apparatus according to an aspect of the invention are described in detail based on embodiments illustrated in the accompanying drawings.

Hereinafter, a description is given taking, as an example, a case where the organic light emitting device according to an aspect of the invention is applied to an organic EL device (active-matrix type organic EL device).

Organic EL Device

First Embodiment

Figure 1:
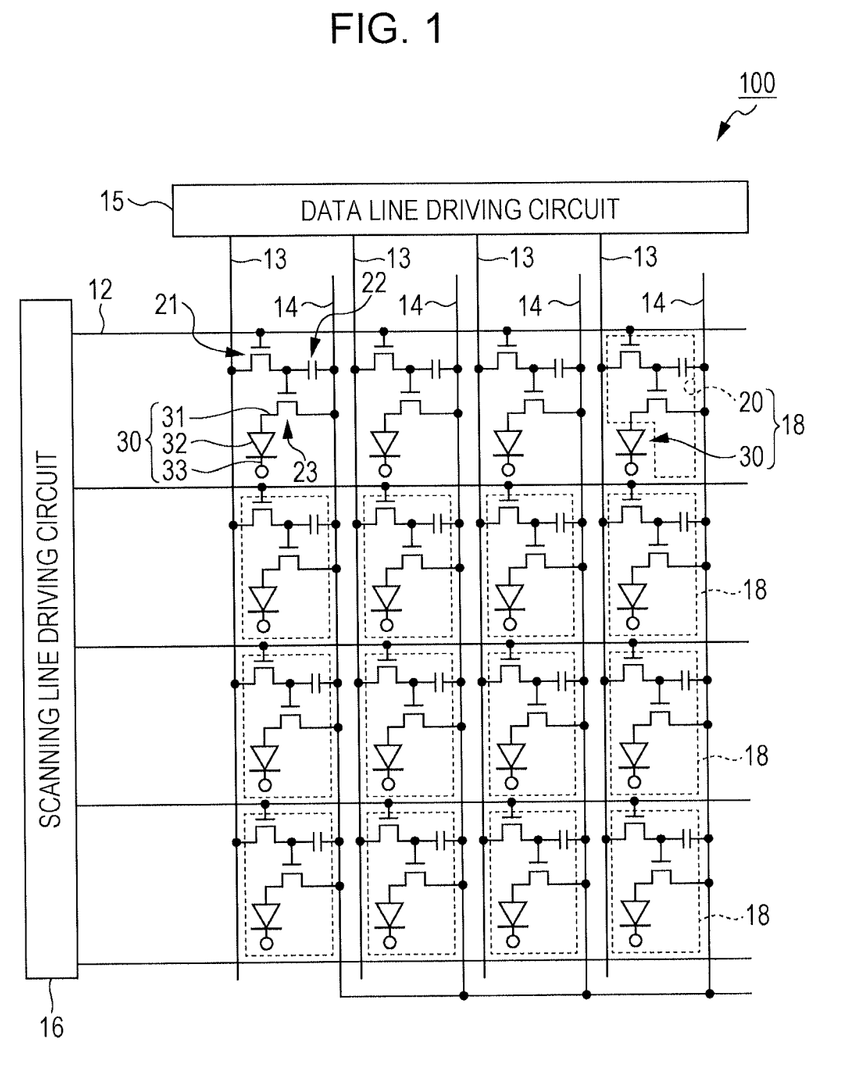
FIG. 1 is an equivalent circuit diagram illustrating the electrical configuration of a first embodiment in which an organic light emitting device according to an aspect of the invention is applied to an organic EL device.
Figure 2:
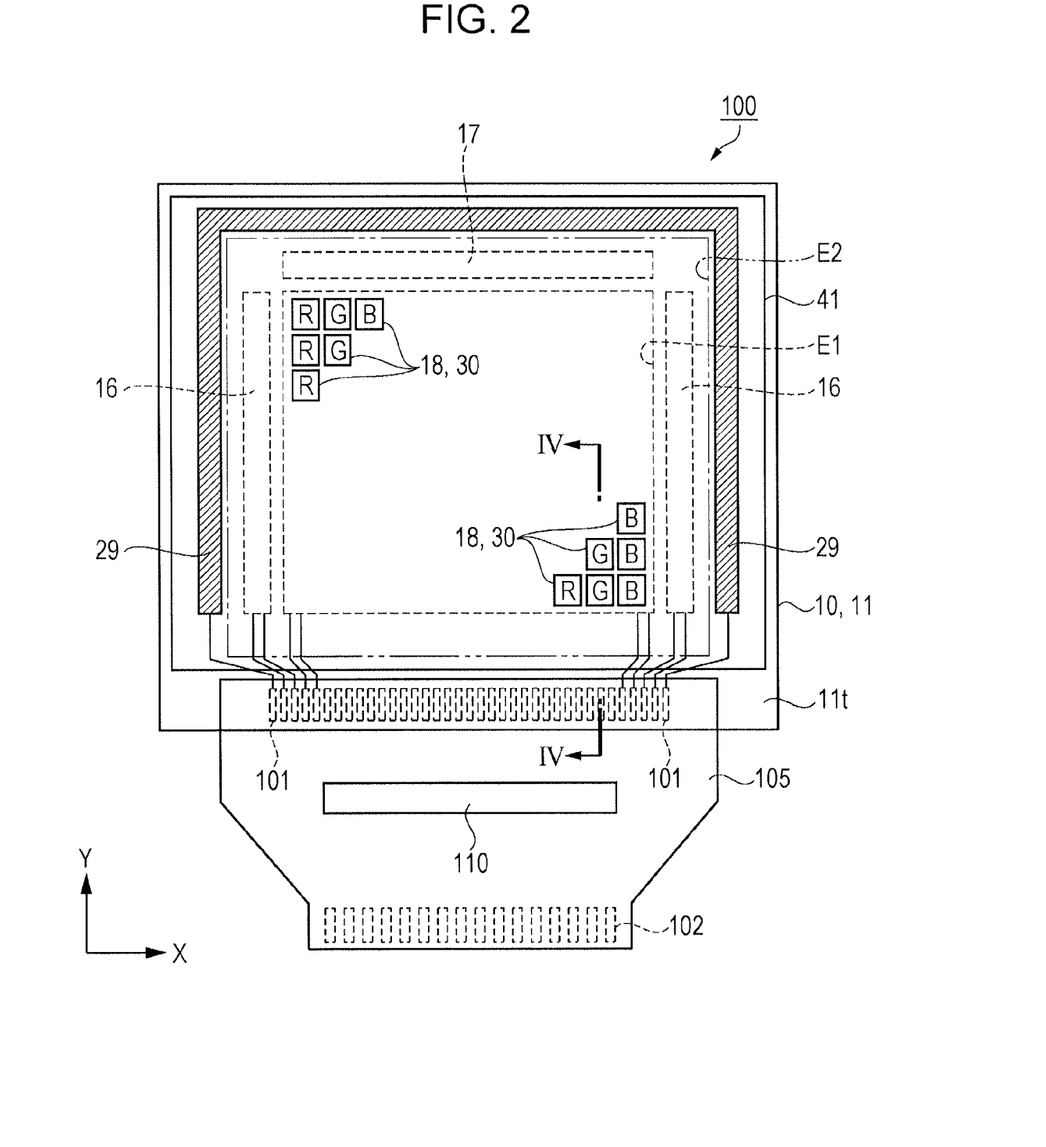
FIG. 2 is a schematic plan view illustrating the configuration of the first embodiment in which the organic light emitting device according to an aspect of the invention is applied to an organic EL device.
Figure 3:
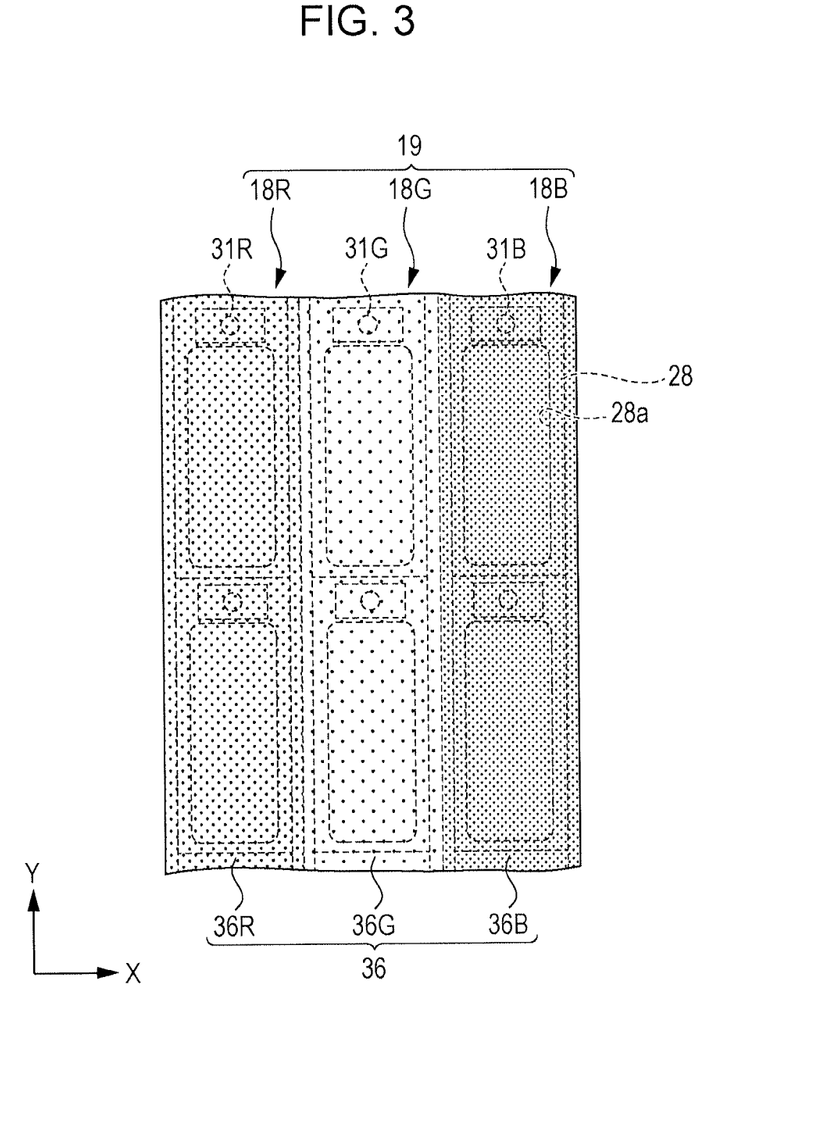
FIG. 3 is a schematic plan view illustrating the arrangement of pixels in the organic EL device illustrated in FIGS. 1 and 2.
Figure 4:
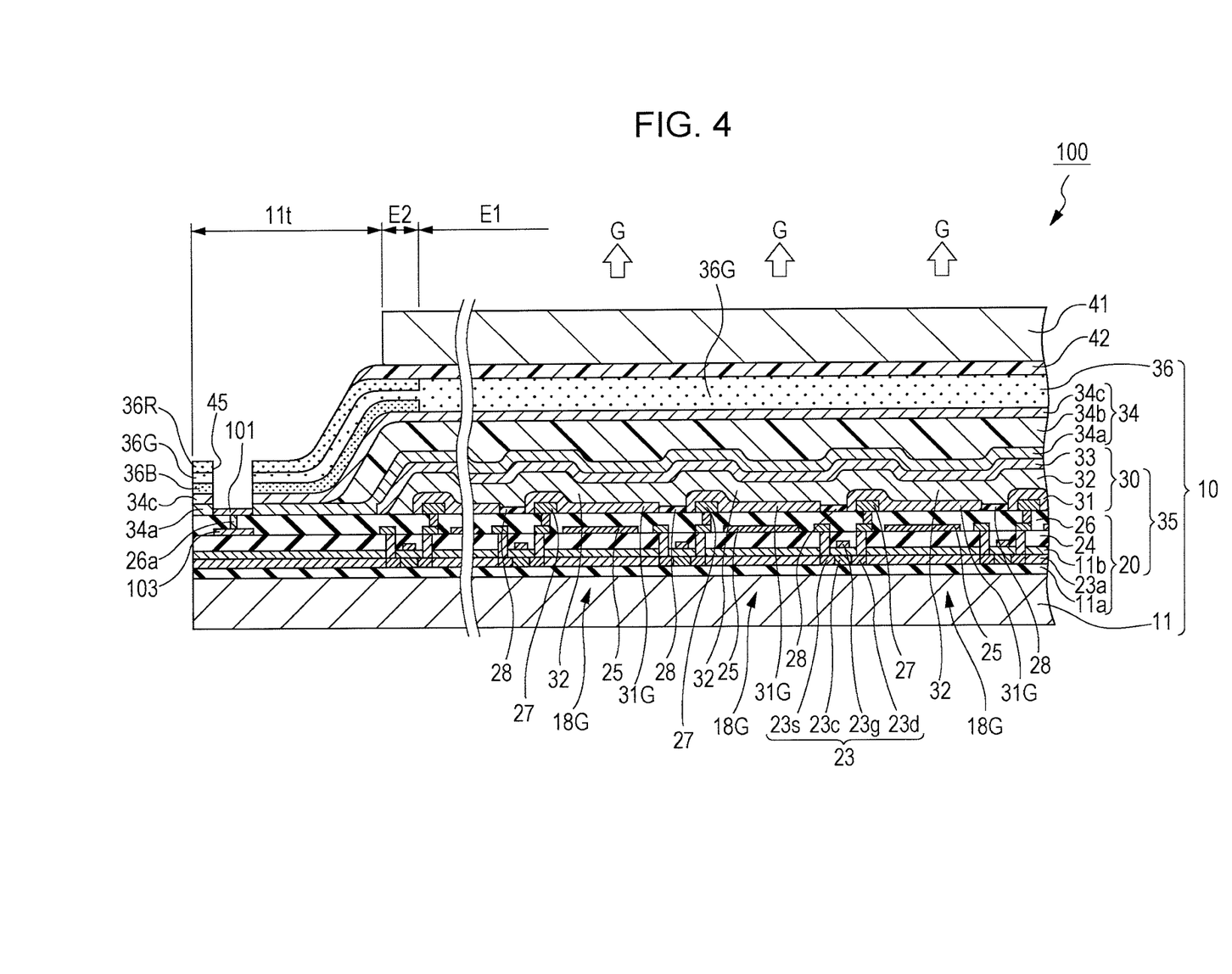
FIG. 4 is a schematic longitudinal cross-sectional view illustrating the structure of the organic EL device along the IV-IV line in FIG. 2.
Figure 5:
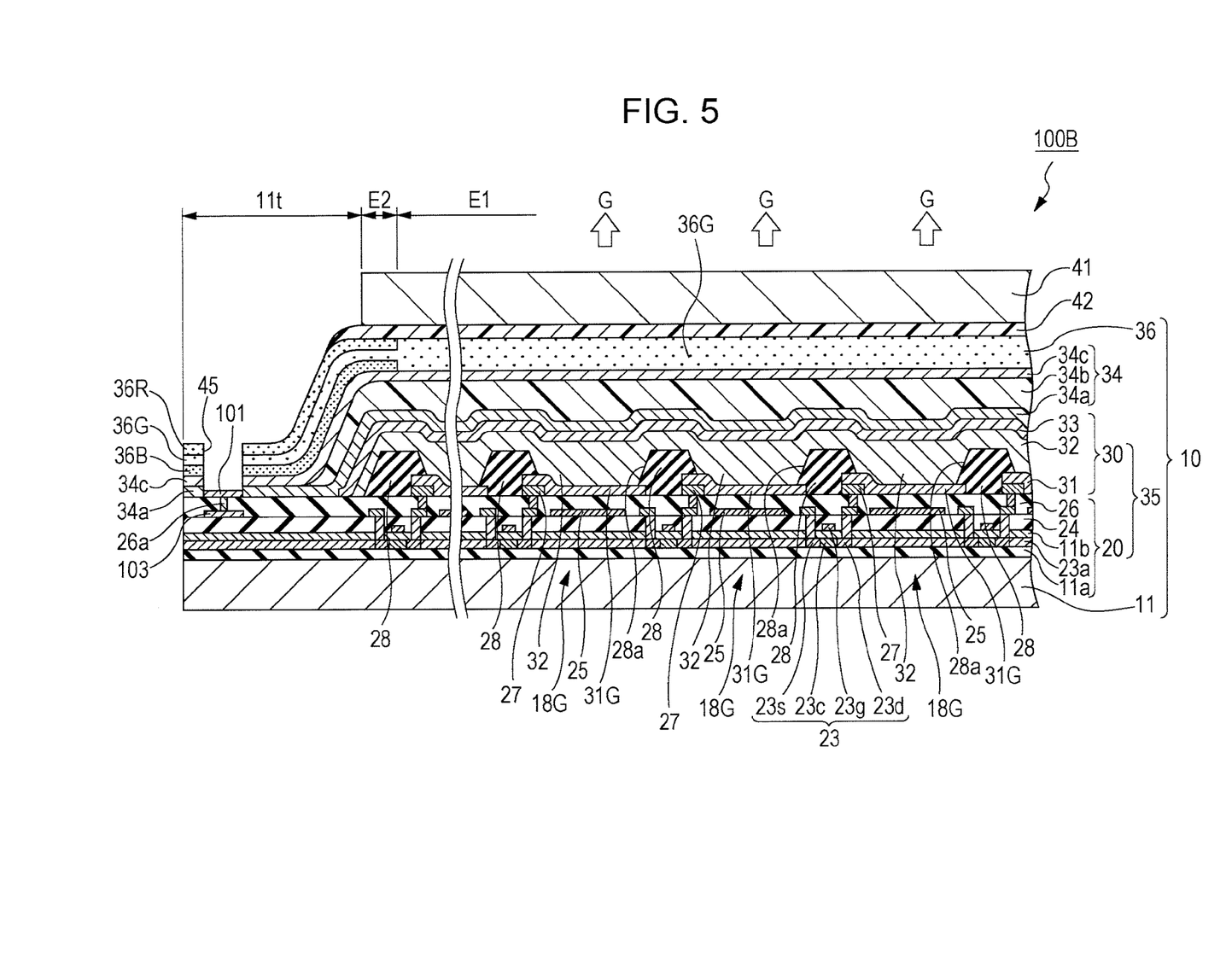
FIG. 5 is a schematic longitudinal cross-sectional view illustrating the structure of a second embodiment in which an organic light emitting device according to an aspect of the invention is applied to an organic EL device.

FIG. 1 is an equivalent circuit diagram illustrating the electrical configuration of a first embodiment in which an organic light emitting device according to an aspect of the invention is applied to an organic EL device. FIG. 2 is a schematic plan view illustrating the configuration of the first embodiment in which the organic light emitting device according to an aspect of the invention is applied to an organic EL device. FIG. 3 is a schematic plan view illustrating the arrangement of pixels in the organic EL device illustrated in FIGS. 1 and 2. FIG. 4 is a schematic longitudinal cross-sectional view illustrating the structure of the organic EL device along the IV-IV line in FIG. 2. In the following description, the front side of FIG. 1 to FIG. 3 is referred to as "Upper", the rear side thereof is referred to as "Lower", the upper side of FIG. 4 and FIG. 5 is referred to as "Upper" and the lower side thereof is referred to as "Lower", for convenience of the description. FIG. 1 to FIG. 4 illustrate each constituent component while varying the dimension, the ratio, and the like as appropriate for ease of understanding of the drawings. In the following embodiment, a description of "on a/the substrate", for example, refers to a case of being disposed in such a manner as to contact a/the substrate, a case of being disposed on a/the substrate via another constituent element, a case of being disposed in such a manner as to partially contact a/the substrate, or a case of being disposed partially via another constituent element.

An organic EL device 100 has a plurality of scanning lines 12 and a plurality of data lines 13 crossing each other and a plurality of power source lines 14 arranged in parallel to each of the plurality of data lines 13 as illustrated in FIG. 1. The organic EL device 100 has scanning line drive circuit 16 to which the plurality of scanning lines 12 are connected and a data line drive circuit 15 to which the plurality of data lines 13 are connected. Moreover, the organic EL device 100 has a plurality of sub-pixels 18 disposed in the shape of a matrix corresponding to each intersection of the plurality of scanning lines 12 and the plurality of data lines 13.

The sub-pixel 18 has an organic EL element 30 which is a light emitting element and a pixel circuit 20 which controls the drive of the organic EL element 30.

The organic EL element 30 has a pixel electrode 31 functioning as an anode, a counter electrode 33 functioning as a cathode, and a functional layer 32 containing an organic light emitting layer provided between the pixel electrode 31 and the counter electrode 33. Such an organic EL element 30 can be regarded as a diode in an electric circuit.

The pixel circuit 20 contains a switching transistor 21, a storage capacitor 22, and a driving transistor 23. The two transistors 21 and 23 can be configured using an n-channel-type or p-channel-type MOS transistor or a thin film transistor (TFT), for example.

The gate of the switching transistor 21 is connected to the scanning line 12, one of the source or the drain is connected to the data line 13, and the other one of the source or the drain is connected to the gate of the driving transistor 23.

One of the source or the drain of the driving transistor 23 is connected to the pixel electrode 31 of the organic EL element 30 and the other one of the source or the drain is connected to the power source line 14.

Furthermore, the storage capacitor 22 is connected between the gate of the driving transistor 23 and the power source line 14.

In the organic EL device 100 having such a structure, when the scanning line 12 is driven, so that the switching transistor 21 is turned ON, the potential based on an image signal to be supplied from the data line 13 at this time is held in the storage capacitor 22 through the switching transistor 21. The ON/OFF state of the driving transistor 23 is determined in accordance with the potential of the storage capacitor 22, i.e., the gate potential of the driving transistor 23. Then, when the driving transistor 23 is turned ON, a current of an amount corresponding to the gate potential flows into the functional layer 32 interposed between the pixel electrode 31 and the counter electrode 33 through the driving transistor 23 from the power source line 14. As a result, the organic EL element 30 emits light corresponding to the amount of the current flowing through the functional layer 32.

The structure of the pixel circuit 20 is not limited to the above and, for example, the pixel circuit 20 may have a light emission controlling transistor which is provided between the pixel electrode 31 and the driving transistor 23 and controls the electrical connection between the pixel electrode 31 and the driving transistor 23.

Moreover, the organic EL device 100 has an element substrate 10 and a counter substrate 41 disposed facing the element substrate 10 as illustrated in FIG. 2.

The element substrate 10 has a display region E1 (indicated by the dashed line in FIG. 2) and a dummy region E2 (indicated by the chain double-dashed line in FIG. 2) on the outside of the display region E1. The outside of the dummy region E2 is a non-display region.

In the display region E1, the sub-pixels 18 are disposed in the shape of a matrix. Each of the sub-pixels 18 has the organic EL element 30 which is a light emitting element as described above and is configured to obtain light emission of one of colors among Red (R), Green (G), and Blue (B) with the operation of the switching transistor 21 and the driving transistor 23.

In this embodiment, the arrangement of the sub-pixels 18 is a so-called stripe-like arrangement in which the sub-pixels 18 from which light emission of the same color is obtained are arranged in a first direction and the sub-pixels 18 from which light emission of different colors is obtained are arranged in a second direction crossing (orthogonal to) the first direction. The following description is given while defining the first direction as the Y direction and defining the second direction as an X direction.

The arrangement of the sub-pixels 18 on the element substrate 10 is not limited to the stripe-like arrangement and may be a mosaic-like arrangement or a delta-like arrangement.

In the dummy region E2, peripheral circuits for mainly causing the organic EL element 30 of each sub-pixel 18 to emit light is provided. For example, a pair of scanning line drive circuits 16 are provided extending in the Y direction at positions between which the display region E1 is interposed in the X direction as illustrated in FIG. 2. An inspection circuit 17 is provided at a position along the display region E1 between the pair of scanning line drive circuits 16.

The element substrate 10 has a wiring layer 29 disposed in such a manner as to surround the dummy region E2 extending in the Y direction along the pair of scanning line drive circuits 16 and in the X direction along the inspection circuit 17. The counter electrode 33 of the organic EL element 30 is formed as a common cathode over the plurality of organic EL elements 30, i.e., the plurality of sub-pixels 18. The counter electrode 33 is formed in such a manner as to reach the non-display region from the display region E1 and is electrically connected to the wiring layer 29 in the non-display region.

The element substrate 10 is larger than the counter substrate 41. On the element substrate 10, a plurality of connection terminals 101 for electrical connection with an external drive circuit are arranged in the X direction in one side portion (which is a side portion between an end portion of the element substrate 10 and the dummy region E2 in the lower part in FIG. 2 and hereinafter sometimes also referred to as "terminal portion 11*t*") protruding from the counter substrate 41 in the Y direction. A flexible circuit substrate (FPC) 105 is connected to the plurality of connection terminals 101. A driving IC 110 is mounted on the FPC 105. The driving IC 110 contains the data line drive circuit 15 described above. The FPC 105 has input terminals 102 connected to the input side of the driving IC 110 through wiring lines and output terminals (not illustrated) connected to the output side of the driving IC 110 through wiring lines. The data lines 13 and the power source lines 14 on the side of the element substrate 10 are electrically connected to the driving IC 110 through the connection terminals 101 and the FPC 105. The wiring lines connected to the scanning line drive circuits 16 or the inspection circuit 17 are electrically connected to the driving IC 110 through the connection terminals 101 and the FPC 105. The counter electrode 33 as a common cathode is also electrically connected to the driving IC 110 through the wiring layer 29, the connection terminals 101, and the FPC 105. Therefore, a control signal, a driving potential (VDD), and the like from the driving IC 110 are supplied to any one of the plurality of connection terminals 101 arranged in the terminal portion 11*t*. As a method for electrically connecting the plurality of connection terminals 101 on the side of the element substrate 10 and the output terminals on the side of the FPC 105, known methods can be used. For example, methods employing a thermoplastic anisotropic electroconductive film and a method employing a thermosetting anisotropic adhesive are mentioned.

Next, the structure of the sub-pixels 18 and the planar arrangement thereof are described with reference to FIG. 3. The organic EL device 100 is configured by combining the organic EL element 30 from which white light emission is obtained and a color filter 36 containing colored layers of Red (R), Green (G), and Blue (B).

As illustrated in FIG. 3, a sub-pixel 18R from which red (R) light emission is obtained, a sub-pixel 18G from which green (G) light emission is obtained, and a sub-pixel 18B from which blue (B) light emission is obtained are arranged in order in the X direction. The sub-pixels 18 from which light emissions of the same color are obtained are arranged in the Y direction. Display is performed using the three sub-pixels 18R, 18G, and 18B arranged in the X direction as one pixel 19.

In this embodiment, the arrangement pitch of the sub-pixels 18R, 18G, and 18B in the X direction is less than 5 µm. The sub-pixels 18R, 18G, and 18B are disposed at an interval of 0.5 µm to 1.0 µm in the X direction. The arrangement pitch of the sub-pixels 18R, 18G, and 18B in the Y direction is less than about 10 µm.

The pixel electrode 31 in the sub-pixel 18 has an approximately rectangular shape and is disposed so that the longitudinal direction runs along the Y direction in this embodiment. The pixel electrodes 31 are sometimes referred to as pixel electrodes 31R, 31G, and 31B corresponding to the light emission colors. Insulating layers 28 are formed which function as partitions for dividing the outer edge of each of the pixel electrodes 31R, 31G, and 31B to insulate the pixel electrodes 31R, 31G, and 31B from each other. Thus, an opening 28a is formed on each of the pixel electrodes 31R, 31G, and 31B. Each of the pixel electrodes 31R, 31G, and 31B contacts the functional layer 32 in the opening 28a. The plane shape of the opening 28a is also an approximately rectangular shape. The approximately rectangular shape includes a rectangle, a shape in which corner portions of a rectangle have a round shape, a shape in which short sides of a rectangle have an arc shape, and the like.

The red (R) colored layers 36R of the color filter 36 are formed in such a manner as to overlap the plurality of pixel electrodes 31R arranged in the Y direction. The green (G) colored layers 36G are formed in such a manner as to overlap the plurality of pixel electrodes 31G arranged in the Y direction. The blue (B) colored layers 36B are formed in such a manner as to overlap the plurality of pixel electrodes 31B arranged in the Y direction. More specifically, the colored layers 36R, 36G, and 36B of different colors are formed extending in the Y direction in a stripe shape and formed so as to contact each other in the X direction.

Next, the structure of the organic EL device 100 is described with reference to FIG. 4.

FIG. 4 illustrates the structure of the sub-pixels 18 in the display region E1 and the structure of the terminal portion 11t on the outside of the dummy region E2.

As illustrated in FIG. 4, the organic EL device 100 has the element substrate 10 containing a base material 11, the pixel circuit 20, the organic EL element 30, a sealing layer 34 sealing the plurality of organic EL elements 30, and the color filter 36 which are successively formed on the base material 11 in the display region E1. The organic EL device 100 also has the counter substrate 41 disposed facing the element substrate 10.

The counter substrate 41 is formed of a transparent substrate, such as glass, for example, and is disposed facing the element substrate 10 through a transparent resin layer 42 so as to protect the color filter 36 formed on the sealing layer 34 in the element substrate 10.

The light emitted from the functional layers 32 of the sub-pixels 18R, 18G, and 18B (the sub-pixel 18G is illustrated in FIG. 4) is reflected on a reflective layer 25 described later and also passes through the color filter 36 and is extracted from the counter substrate 41 side. More specifically, the organic EL device 100 is a top-emission-type light emission device.

Since the organic EL device 100 is of the top-emission-type, transparent substrates, such as glass, opaque substrates, such as silicon and ceramics, can be used for the base material 11. The following description is given taking a case where a MOS transistor is used for the pixel circuit 20 as an example.

A first insulating film 11a is formed covering the surface of the base material 11. A semiconductor layer 23a of the driving transistor 23 is formed covering the first insulating film 11a. A second insulating film 11b functioning as a gate insulating film is formed covering the semiconductor layer 23a. A gate electrode 23g is formed at a position facing a channel region 23c of the semiconductor layer 23a through the second insulating film 11b. A first interlayer insulating film 24 is formed with a film thickness of 300 nm to 2 µm, for example, covering the gate electrode 23g. The first interlayer insulating film 24 is subjected to planarization treatment so as to remove irregularities of the surface generated by covering the driving transistors 23 and the like of the pixel circuits 20. Contact holes penetrating the second insulating film 11b and the first interlayer insulating film 24 are formed corresponding to each of source regions 23s and drain regions 23d of the semiconductor layer 23a. An electroconductive film is formed in such a manner as to fill the contact holes, and then patterned, so that electrodes and wiring lines to be connected to the driving transistor 23 are formed. The electroconductive film is formed using light reflective aluminum, alloys of aluminum and Ag (silver) and Cu (copper), and the like, for example. By patterning the electroconductive film, the reflective layer 25 is formed in each sub-pixel 18. Although not illustrated in FIG. 4, the switching transistor 21 and the storage capacitor 22 in the pixel circuit 20 are also formed on the base material 11.

Furthermore, a second interlayer insulating film 26 is formed with a film thickness of 10 nm to 2 µm, for example, covering the reflective layer 25 and the first interlayer insulating film 24. Contact holes for electrically connecting the pixel electrodes 31 and the driving transistors 23 are formed so as to penetrate the second interlayer insulating film 26. As materials forming the first insulating film 11a, the second insulating film 11b, the first interlayer insulating film 24, and the second interlayer insulating film 26, oxides and nitrides of silicon or oxynitrides of silicon can be used, for example.

An electroconductive film (first electroconductive film) is formed so as to cover the second interlayer insulating film 26 in such a manner as to fill the contact holes formed in the second interlayer insulating film 26. By patterning the electroconductive film, contact electrodes 27 are formed. Furthermore, an electroconductive film (second electroconductive film) is formed so as to cover the contact electrodes 27. By patterning the electroconductive film, the pixel electrodes 31 (31R, 31G, 31B) (the sub-pixel 18G is illustrated in FIG. 4) are formed. The contact electrodes (connection electrodes) 27 are formed using aluminum or alloys thereof. The pixel electrodes 31 (31R, 31G, 31B) are formed using transparent electroconductive films, such as indium tin oxide (ITO).

The insulating layers (partition) 28 are formed dividing the outer edge part of each of the pixel electrodes 31R, 31G, and 31B. Thus, the insulation properties of each of the pixel electrode 31R, 31G, and 31B are secured and also the openings 28a are formed on the pixel electrodes 31R, 31G, and 31B. The insulating layers 28 are formed using an acryl-based photosensitive resin, for example, in such a manner as to divide each of the pixel electrodes 31R, 31G, and 31B with a height of about 1 µm.

In this embodiment, in order to insulate the pixel electrodes 31R, 31G, and 31B from each other, the insulating layers 28 containing a photosensitive resin are formed but each of the pixel electrodes 31R, 31G, and 31B may be divided using inorganic insulating materials, such as silicon oxide.

The functional layer 32 is formed using vapor phase processes, such as a vacuum evaporation method and an ion plating method, in such a manner as to contact each of the pixel electrodes 31R, 31G, and 31B (the sub-pixel 18G is illustrated in FIG. 4). The surface of the insulating layers 28 is also covered with the functional layer 32. The functional layer 32 does not need to cover the entire surface of the insulating layers 28 and the functional layer 32 may be formed in regions divided by the insulating layers 28. Therefore, top portions of the insulating layers 28 do not always need to be covered with the functional layer 32 as illustrated in FIG. 4.

The functional layer 32 has a hole injection layer, a hole transport layer, an organic light emitting layer, and an electron transport layer, for example. In this embodiment, the functional layer 32 is formed by individually forming the hole injection layer, the hole transport layer, the organic light emitting layer, and the electron transport layer on the pixel electrode 31 using a vapor phase process, and then successively laminating the layers. The layer structure of the functional layer 32 is not limited thereto, and an intermediate layer controlling the movement of holes and electrons which are carriers may be contained.

The organic light emitting layer may be configured to obtain white light emission. For example, a structure can be adopted in which an organic light emitting layer from which red light emission is obtained, an organic light emitting layer from which green light emission is obtained, and an organic light emitting layer from which blue light emission is obtained are combined.

Subsequently, the counter electrode 33 as a common cathode is formed covering the functional layer 32. The counter electrode 33 is formed by forming an alloy of Mg and Ag, for example, with a film thickness (for example, 10 nm to 30 nm) in such a manner as to achieve light transmission properties and light reflectivity. Thus, a plurality of organic EL elements 30 are formed on the base material 11.

By forming the counter electrode 33 so as to have light transmission properties and light reflectivity, an optical resonator may be configured between the reflective layer 25 and the counter electrode 33 in each of the sub-pixels 18R, 18G, and 18B. The optical resonator allows extraction of light of a specific resonant wavelength by varying the optical distance between the reflective layer 25 and the counter electrode 33 in each of the sub-pixels 18R, 18G, and 18B. Thus, the color purity of the light emission from each of the sub-pixels 18R, 18G, and 18B can be increased. The optical distance is determined as the total of the products of the refractive index and the film thickness of various kinds of functional films interposed between the reflective layer 25 and the counter electrode 33 configuring the optical resonator. Therefore, as methods for varying the optical distance in each of the sub-pixels 18R, 18G, and 18B, a method for varying the film thickness of the pixel electrodes 31R, 31G, and 31B and a method for varying the film thickness of the second interlayer insulating film 26 between the reflective layer 25 and the pixel electrodes 31R, 31G, and 31B are applicable.

Subsequently, in order to prevent the entry of water, oxygen, and the like, the sealing layer 34 covering the plurality of organic EL elements 30 is formed.

In the sealing layer 34, a first sealing layer (cathode protection layer) 34a, a buffer layer (planarization layer) 34b, and a second sealing layer (gas barrier layer) 34c are successively laminated from the counter electrode 33 side in the invention.

The first sealing layer 34a and the second sealing layer 34c mainly contain silicon oxynitride (SiON) and the buffer layer 34b contains resin materials, such as epoxy-based resin and acryl-based resin, as the main material in this embodiment.

Herein, when it is supposed that both the first sealing layer 34a and the second sealing layer 34c mainly contain silicon oxynitride as described in "Related Art" above, not only the second sealing layer (gas barrier layer) 34c but the first sealing layer (cathode protection layer) 34a sometimes exhibit gas barrier properties which prevent entry of moisture, oxygen, and the like.

In this case, when it is supposed that defective portions where the gas barrier properties locally decrease are generated in both of the two layers (particularly when the defective portions are generated at positions separated from each other as viewed in plan) resulting from mixing of foreign substance in the layers or occurrence of a defect in the structure in the layers, for example, it takes a certain period of time for moisture, oxygen, and the like to enter the functional layer 32 passing through the two defective portions. Therefore, there has been a problem that the generation of the dark spots is not detected as an initial failure but the dark spots are generated during the use by a purchaser after shipping the organic EL device 100, so that the reliability of the organic EL device 100 decreases.

To address the problem, the heavy hydrogen diffusion coefficient at 85° C. in a heavy hydrogen atmosphere in the first sealing layer 34a out of the first sealing layer 34a and the second sealing layer 34c is set to $1.0 \times 10^{-21}$ m$^2$/sec or more in the invention of this application.

According to the examination of the present inventors, it can be said that, by configuring the first sealing layer 34a to have such a heavy hydrogen diffusion coefficient, the first sealing layer 34a is configured to permit the entering (transmission) of moisture (vapor) or oxygen, i.e., not have the gas barrier properties.

Therefore, when the defective portion is generated in the second sealing layer (gas barrier layer) 34c which is originally formed as a gas barrier layer which prevents the entry of moisture, oxygen, and the like, the defective portion can be detected as the generation of the dark spots at an early stage, i.e., detected as an initial failure of the organic light emitting device 100. Thus, by removing the defective portion as an initial failure by inspection, a reduction in the light emission properties resulting from the generation of the dark spots is suppressed or prevented over a long period of time in the organic EL element 30 of each of the sub-pixels 18 in the organic EL device 100 which has passed the inspection. Therefore, an improvement of the reliability of the organic EL device 100 during the use can be achieved.

As the index that the heavy hydrogen diffusion coefficient of the first sealing layer 34a is $1.0 \times 10^{-21}$ m$^2$/sec or more, the present inventors have found that, in the case where it is supposed that the first sealing layer 34a mainly contains silicon oxynitride as in this embodiment, when transmittance of the first sealing layer is measured by a Fourier-transform infrared spectrophotometer (FTIR) and a transmittance at the peak (peak showing the main structure of SiON) appearing around 1000 cm$^{-1}$ is defined as A [%] and a transmittance at the peak (peak showing Si—OH and NH vibration) appearing around 3200 cm$^{-1}$ is defined as B [%], the heavy hydrogen diffusion coefficient of the first sealing layer 34a can be set to $1.0 \times 10^{-21}$ m$^2$/sec or more by setting B/A to 0.6 or more.

More specifically, the first sealing layer 34a mainly containing silicon oxynitride is formed (film formation) using a vapor phase film formation method, such as an ion plating method, as described later. The first sealing layer 34a containing silicon oxynitride can also be formed in a state where a part of silicon molecules in the film is not bonded to other silicon atoms, oxygen atoms, and nitrogen atoms. Then, the heavy hydrogen diffusion coefficient can be set to a predetermined heavy hydrogen diffusion coefficient by increasing the ratio of silicon atoms which are not bonded to the bonded silicon atoms. In such a first sealing layer 34a, the B/A ratio greatly varies depending on the bond state in the film. Further, by setting the B/A ratio to 0.6 or more, it can be said that the first sealing layer 34a is in a non-dense state. As a result, the present inventors have found that the defective portions where the gas barrier properties decrease are uniformly formed in the entire first sealing layer 34a.

A method for forming the first sealing layer 34a mainly containing silicon oxynitride in such a manner as to satisfy that the heavy hydrogen diffusion coefficient in the layer at 85° C. in a heavy hydrogen atmosphere is $1.0 \times 10^{-21}$ m$^2$/sec or more, i.e., the first sealing layer 34a is in a non-dense state, is described in a description of a method for manufacturing the organic EL device described later.

When the B/A ratio is 0.6 or more, the heavy hydrogen diffusion coefficient of the first sealing layer 34a can be set to $1.0 \times 10^{-21}$ m$^2$/sec or more but the B/A ratio is preferably 0.7 or more. Thus, the transmission of moisture (vapor) or oxygen can be surely permitted and the heavy hydrogen diffusion coefficient of the first sealing layer 34a can be set to $1.0 \times 10^{-21}$ m$^2$/sec or more and also, in a method for manufacturing the organic EL device described later, the permission of the transmission (entering) of a liquid material for use in the liquid phase film formation method can be surely prevented when the buffer layer 34b is formed on the first sealing layer 34a using a liquid phase film formation method. More specifically, the first sealing layer 34a can be caused to surely exhibit the function as a cathode protection layer.

The average thickness of the first sealing layer 34a is not particularly limited and is preferably about 100 nm or more and 2000 nm or less and more preferably about 200 nm or more and 1000 nm or less, for example. Thus, when the B/A ratio is set to 0.6 or more, the first sealing layer 34a can be configured so that the transmission of moisture (vapor) or oxygen is surely permitted and the transmission of liquid material (liquid component) is not permitted.

This embodiment describes the case where the first sealing layer 34a mainly contains silicon oxynitride. However, the first sealing layer 34a may contain various inorganic materials as the main material insofar as the heavy hydrogen diffusion coefficient in the layer is $1.0 \times 10^{-21}$ m$^2$/sec or more. In the case of the first sealing layer 34a containing inorganic materials as the main material, when the buffer layer 34b is formed on the first sealing layer 34a using a liquid phase film formation method in the method for manufacturing the organic EL device described later, the function as a cathode protection layer which prevents the permission of the transmission (entering) of a liquid material for use in a liquid phase film formation method can be surely exhibited.

Examples of the inorganic materials include not only silicon oxynitride but silicon oxide, silicon nitride, aluminum oxide, tantalum oxide, tantalum nitride, tantalum nitride, titanium oxide, titanium nitride, titanium nitride, and the like and these inorganic materials can be used alone or in combination of two or more kinds thereof. Among the above, at least one kind of silicon oxynitride (SiON), silicon oxide (SiO$_2$), and silicon nitride (SiN) is preferable. By the use of the substances, the heavy hydrogen diffusion coefficient in the first sealing layer 34a can be easily set to $1.0 \times 10^{-21}$ m$^2$/sec or more. When the first sealing layer 34a contains at least one kind of silicon oxide and silicon nitride, the heavy hydrogen diffusion coefficient in the first sealing layer 34a can be set to $1.0 \times 10^{-21}$ m$^2$/sec or more by setting the film thickness, forming the layer at a low temperature when forming the layer using a vapor phase film formation method, and the like, for example.

The second sealing layer (gas barrier layer) 34c is a layer mainly containing silicon oxynitride (SiON) and having gas barrier properties which prevent the entry of moisture, oxygen, and the like similarly as in the case of the first sealing layer (cathode protection layer) 34a. Due to the function of the second sealing layer 34c, the sealing layer 34 prevents the entry of moisture, oxygen, and the like into the functional layer 32.

The B/A ratio of the second sealing layer 34c is preferably 0.01 or more and less than 0.5. Thus, the second sealing layer 34c can be formed into a denser layer and can be configured so that the transmission of moisture (vapor) or oxygen is not surely permitted.

The average thickness of the second sealing layer 34c is not particularly limited and is preferably about 100 nm or more and 2000 nm or less and more preferably about 400 nm or more and 1000 nm or less, for example. Thus, when the B/A ratio is set to 0.01 or more and less than 0.5, the second sealing layer 34c can be configured so that the transmission of moisture (vapor) or oxygen is not surely permitted.

The buffer layer 34b contains a resin material as the main material.

Due to the fact that the buffer layer 34b is interposed between the first sealing layer 34a and the second sealing layer 34c, the functions of both the first sealing layer 34a and the second sealing layer 34c can be surely exhibited.

By forming the buffer layer 34b by coating using printing methods, such as a screen printing method, a fixed-quantity discharging method, or the like in the method for manufacturing the organic EL device described later, the surface (upper surface) of the buffer layer 34b can be planarized to be configured from a flat surface. As a result, the buffer layer 34b functions also as a planarization layer which reduces irregularities of the surface of the first sealing layer 34a and forms the second sealing layer 34c as a flat layer.

As constituent materials of the buffer layer 34b, various resin materials having transparency can be used. For example, epoxy-based resin, acryl-based resin, and the like are mentioned and one or two or more kinds of the materials can be used and epoxy resin is particularly preferable. By the use of epoxy-based resin, the buffer layer 34b can be caused to more surely exhibit the function as a planarization layer.

The average thickness of the buffer layer 34b is not particularly limited and is preferably about 1 μm or more and 5 μm or less and more preferably about 3 μm, for example. Thus, the buffer layer 34b can be caused to more surely exhibit the function as a planarization layer.

On the sealing layer 34, the colored layers 36R, 36G, and 36B (the colored layer 36G is illustrated in FIG. 4) corresponding to the sub-pixels 18R, 18G, and 18B of the colors described above are formed. As a method for forming the color filter 36 containing the colored layers 36R, 36G, and 36B, a method is mentioned which includes applying a photosensitive resin material containing a coloring material to form a photosensitive resin layer, and then exposing and developing the photosensitive resin layer by a photolithography method to form the color filter 36. The film thickness of the colored layers 36R, 36G, and 36B may be the same in all the colored layers or the film thickness of at least one colored layer may be varied from the film thickness of the other colored layers.

The element substrate 10 and the counter substrate 41 are disposed facing each other with a gap. The gap is filled with a transparent resin material, so that the transparent resin layer 42 is configured. As the transparent resin material, resin materials of a urethane type, an acryl type, an epoxy type, a polyolefin type, and the like can be mentioned, for example. The thickness of the transparent resin layer 42 is 10 µm to 100 µm.

As illustrated in FIG. 4, the organic EL device 100 has the element substrate 10 containing the base material 11, the pixel circuit 20, the organic EL element 30, the sealing layer 34 sealing the plurality of organic EL elements 30, and the color filter 36 which are successively formed on the base material 11 in the display region E1. Moreover, the organic EL device 100 has the counter substrate 41 disposed facing the element substrate 10.

In the element substrate 10, the pixel circuit 20 is configured by the first insulating film 11a, the semiconductor layer 23a, the second insulating film 11b, the first interlayer insulating film 24, and the second interlayer insulating film 26, the organic EL element 30 is configured by the pixel electrode 31, the functional layer 32, and the counter electrode 33, and a mounting substrate 35 is configured by the pixel circuit 20 and the organic EL element 30.

Next, the structures of the terminal portion 11t and the peripheral of the terminal portion 11t of the element substrate 10 are described. As illustrated in FIG. 4, the connection terminal 101 is formed on the second interlayer insulating film 26 similarly as in the case of the pixel electrode 31 in the terminal portion 11t of the element substrate 10. The connection terminal 101 is connected to a wiring layer 103 formed on the first interlayer insulating film 24 through an electroconductive film in a contact hole 26a formed in the second interlayer insulating film 26. FIG. 4 does not illustrate the structure of the pixel circuit 20, signal wiring lines connected to the pixel circuit 20, and the peripheral circuit, such as the scanning line drive circuits 16, on the base material 11 but each of the plurality of connection terminals 101 is electrically connected to these circuits and the signal wiring lines through the wiring layer 103.

The wiring layer 103 is preferably patterned together with the reflective layer 25 utilizing an electroconductive film formed on the first interlayer insulating film 24 but may be formed of a constituent material different from that of the reflective layer 25.

The connection terminal 101 is preferably patterned together with the pixel electrode 31 utilizing an electroconductive film formed on the second interlayer insulating film 26 but may be formed of a constituent material different from that of the pixel electrode 31.

In the terminal portion 11t of the element substrate 10, the first sealing layer 34a, the second sealing layer 34c, the colored layer 36B, the colored layer 36G, and the colored layer 36R are successively laminated and an opening portion 45 penetrating these layers is formed in the connection terminal 101. These layers are not formed in at least one part on the connection terminal 101, so that the connection terminal 101 is exposed in the opening portion 45.

In other words, the first sealing layer 34a and the second sealing layer 34c containing inorganic materials of the sealing layer 34 are not only formed so as to cover the plurality of organic EL elements 30 in the display region E1 (FIG. 2) but are formed so as to cover the terminal portion 11t. In the color filter 36, the colored layers 36R, 36G, and 36B are formed in the order of Red (R), Green (G), and Blue (B) corresponding to the sub-pixels 18R, 18G, and 18B and all the colored layers 36R, 36G, and 36B are formed so as to cover not only the display region E1 but the terminal portion 11t. The opening portion 45 is formed so as to penetrate the first sealing layer 34a, the second sealing layer 34c, the colored layer 36B, the colored layer 36G, and the colored layer 36R.

The three colored layers 36R, 36G, and 36B are formed so as to reach the insulating layer 28 on a boundary portion between the dummy region E2 (FIG. 2) and the display region E1 from the outer edge on the side of the peripheral edge of the element substrate 10 of the terminal portion 11t and the colored layers 36R, 36G, and 36B overlapped with the insulating layers 28 are protected by the counter substrate 41 through the transparent resin layer 42.

Method for Manufacturing Organic EL Device

Next, a method for manufacturing the organic EL device of the first embodiment is described.

The method for manufacturing the organic EL device 100 has a pixel circuit formation process, an organic EL element formation process, a sealing layer formation process, a color filter formation process, a sealing layer etching process, and a substrate bonding process.

[1] First, the base material 11 is prepared, and then the pixel circuit 20 is formed on the base material 11 (Pixel circuit formation process).

In the formation of the pixel circuit 20, peripheral circuits, signal wiring lines, the reflective layer 25, the contact electrode 27, and the like are also formed.

As a method for forming the pixel circuit 20 and the like on the base material 11, known methods can be used.

[2] Next, the organic EL element 30 is formed on the pixel circuit 20 (Organic EL element formation process).

In the formation of the organic EL element 30, the insulating layer 28 and the like are also formed.

As a method for forming the organic EL element 30 and the like on the pixel circuit 20, known methods can be used.

[3] Next, the first sealing layer 34a covering the counter electrode 33 of the organic EL element 30 and the terminal portion 11t is formed.

A method for forming the first sealing layer 34a is not particularly limited, and, for example, vapor phase film formation methods, such as an ion plating method, a vacuum evaporation method, a sputtering method, and a laser ablation method, are mentioned and, among the above, the ion plating method is preferable.

By forming the first sealing layer 34a using the ion plating method, when granular materials containing silicon oxynitride are laminated on the counter electrode 33, a film component flying to the counter electrode 33 can be caused to fly along the thickness direction (in parallel to) of the counter electrode 33 (base material 11). More specifically, the film component can be caused to fly with excellent directivity along the thickness direction of the counter electrode 33. Therefore, the first sealing layer 34a having uniform film quality can be formed on the counter electrode 33 and the terminal portion 11t.

Moreover, by forming the first sealing layer 34a using the ion plating method and setting the film formation conditions in the formation of the first sealing layer 34a as appropriate, the first sealing layer 34a having a heavy hydrogen diffusion coefficient in the layer of $1.0 \times 10^{-21}$ m$^2$/sec or more can be surely formed.

Examples of the film formation conditions set as appropriate when forming the first sealing layer 34a include the film thickness of the first sealing layer 34a to be formed, the temperature, the pressure, the discharge current value, the Gun Ar flow rate, and the like in the film formation. By setting these conditions, the heavy hydrogen diffusion coefficient in the first sealing layer 34a can be easily set to $1.0 \times 10^{-21}$ m$^2$/sec or more.

[4] Next, the buffer layer 34b covering the first sealing layer 34a is formed.

The buffer layer 34b contains a resin material having transparency. As a method for forming the buffer layer 34b, a method which includes applying a liquid material (solution) containing a resin material and a solvent in which the resin material is soluble by printing methods, such as a screen printing method, or liquid phase film formation methods, such as a fixed-quantity discharging method, is preferably used, for example. By the use of such a method, the buffer layer 34b containing the resin material and having a planarized upper surface can be formed with an excellent accuracy.

In this process [4], the buffer layer 34b is formed by supplying the liquid material onto the first sealing layer 34a. In this case, the first sealing layer 34a is configured by a film which does not permit the transmission (entering) of the liquid material as described above. Therefore, in this process [4], deterioration and degradation of the functional layer 32 due to the contact of the functional layer 32 with the liquid material can be accurately suppressed and prevented.

[5] Next, the second sealing layer 34c covering the buffer layer 34b is formed.

As a method for forming the second sealing layer 34c, the same methods as the methods described as the method for forming the first sealing layer 34a are used.

In the formation of the second sealing layer 34c on the buffer layer 34b, the second sealing layer 34c is formed in such a manner that a function as a gas barrier layer having gas barrier properties which prevent the entry of moisture, oxygen, and the like is given to the second sealing layer 34c. More specifically, the second sealing layer 34c is formed by setting the film formation conditions when forming the second sealing layer 34c as appropriate in such a manner that the heavy hydrogen diffusion coefficient in the second sealing layer 34c is less than $1.0 \times 10^{-21}$ m$^2$/sec, in other words, the B/A ratio is less than 0.6.

A sealing layer formation process is configured by the processes [3] to [5] above.

[6] Next, the blue (B) colored layer 36B is formed.

The colored layer 36B can be formed by applying a photosensitive resin containing a blue coloring material by a spin coating method, and then drying the same to form a photosensitive resin layer, and then exposing and developing the photosensitive resin layer, for example.

It is preferable to pattern (expose and develop) the colored layer 36B in such a manner as to be formed at a position corresponding to each sub-pixel 18B and in such a manner that the opening portion 45 is formed in a portion overlapped with the connection terminal 101 in the terminal portion 11t.

[7] Next, the green (G) colored layer 36G is formed.

It is preferable to form the colored layer 36G in the same manner as in the colored layer 36B and pattern (expose and develop) the colored layer 36G in such a manner as to be formed at a position corresponding to each sub-pixel 18G and in such a manner that the opening portion 45 is formed in a portion overlapped with the connection terminal 101 in the terminal portion 11t.

[8] Next, the red (R) colored layer 36R is formed.

It is preferable to form the colored layer 36R in the same manner as in the colored layer 36B and pattern (expose and develop) the colored layer 36R in such a manner as to be formed at a position corresponding to each sub-pixel 18R and in such a manner that the opening portion 45 is formed in a portion overlapped with the connection terminal 101 in the terminal portion 11t.

A color filter formation process is configured by the processes [6] to [8] above.

[9] Next, the first sealing layer 34a and the second sealing layer 34c which remain are removed to thereby expose the connection terminal 101 in the opening portion 45 (sealing layer etching process).

As a method for removing the first sealing layer 34a and the second sealing layer 34c, a dry etching method employing the colored layers 36R, 36O, and 36B as a mask is preferably used, for example.

[10] Next, the element substrate 10 and the counter substrate 41 are bonded to each other through the transparent resin layer 42 containing a transparent resin material (substrate bonding process).

The bonding can be performed by, for example, applying a transparent resin material having adhesiveness in such a manner as to cover the color filter 36, and then pressing the counter substrate 41 to the base material 11 side, for example, in a state where the counter substrate 41 is disposed at a predetermined position facing the element substrate 10 to which the transparent resin material is applied.

As the transparent resin material, a thermosetting epoxy resin is mentioned, for example.

The thickness of the transparent resin layer 42 is not particularly limited and is set to about 10 μm or more and 100 μm or less.

After the process [1] to process [10], the FPC 105 is mounted on the terminal portion 11t of the element substrate 10 as illustrated in FIG. 2, whereby the organic EL device 100 can be obtained.

Second Embodiment

Next, a second embodiment is described in which the organic light emitting device according to an aspect of the invention is applied to an organic EL device.

FIG. 5 is a schematic longitudinal cross-sectional view illustrating the structure of the second embodiment in which the organic light emitting device according to an aspect of the invention is applied to an organic EL device.

Hereinafter, an organic EL device 100B in the second embodiment is described focusing on differences from the organic EL device 100 in the first embodiment and a description of the same matter is omitted.

The organic EL device 100B illustrated in FIG. 5 is the same as the organic EL device 100 illustrated in FIG. 1, except the fact that the insulating layer 28 is provided so as to cover the outer edge of each of the pixel electrodes 31R, 31G, and 31B and to be higher in height than the contact electrode 27.

More specifically, in the organic EL device 100B of the second embodiment, the insulating layer 28 covering the outer edge of each of the pixel electrodes 31R, 31G, and 31B is provided to be higher in height than the contact electrode 27.

The organic light emitting device according to an aspect of the invention can be applied also by such an organic EL device 100B of the second embodiment similarly as in the case of the first embodiment.

Electronic Apparatus

Next, a head mounted display to which an electronic apparatus according to an aspect of the invention is applied is described.

Figure 6:
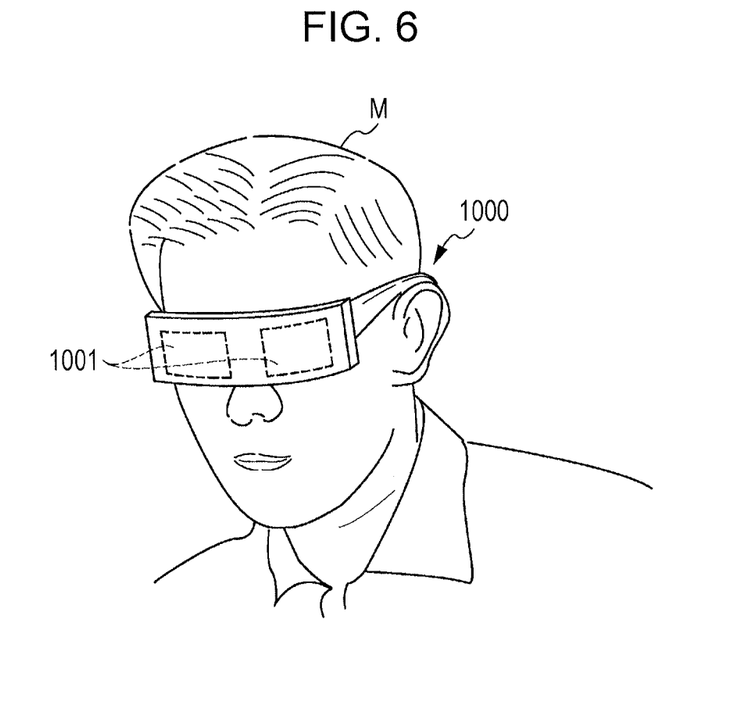
FIG. 6 is a schematic view in which an electronic apparatus according to an aspect of the invention is applied to a head mounted display.

FIG. 6 is a schematic view in which the electronic apparatus according to an aspect of the invention is applied to a head mounted display.

As illustrated in FIG. 6, a head mounted display (HMD) 1000 as the electronic apparatus according to an aspect of the invention has two display portions 1001 provided corresponding to the right and left eyes. An observer M can see characters, images, and the like displayed on the display portions 1001 by attaching the head mounted display 1000 to the head similarly as in the case of glasses. For example, when images in consideration of the parallax are displayed on the right and left display portions 1001, a three-dimensional image can also be seen and enjoyed.

On the display portions 1001, the organic EL device 100 or 100B of the first embodiment or the second embodiment described above, respectively, is mounted.

Therefore, the head mounted display 1000 has the organic EL devices 100 and 100B having the organic EL element 30 in which a reduction in light emission properties resulting from the generation of dark spots is suppressed or prevented over a long period of time. Therefore, the head mounted display 1000 with high reliability can be provided.

The head mounted display 1000 is not limited to having the two display portions 1001 and may be configured to have one display portion 1001 corresponding to either the right or left eye.

Moreover, the electronic apparatus according to an aspect of the invention can also be applied to not only the head mounted display of FIG. 6 but, for example, personal computers (mobile personal computers), tablet terminals, smart phones, cellular phones, watches, digital still cameras, televisions, video cameras, viewfinder type and monitor direct-viewing type videotape recorders, laptop type personal computers, car navigation devices, pagers, electronic notebooks (also containing those having communication functions), electronic dictionaries, calculators, electronic game machines, word processors, workstations, TV phones, television monitors for crime prevention, electronic binoculars, POS terminals, devices having touch panels (for example, cash dispensers of financial institutions, automatic machines for selling tickets), medical instruments (for example, electronic body thermometers, blood pressure meters, blood sugar meters, electrocardiograph display devices, ultrasonic diagnostic devices, display devices for endoscopy), fish finders, various measurement devices, instruments (for example, instruments for vehicles, aircrafts, and ships), flight simulators, other various monitors, projection type display devices, such as a projector, and the like.

As described above, the organic light emitting device and the electronic apparatus according to an aspect of the invention are described based on the embodiments illustrated in the drawings but the invention is not limited thereto.

For example, the structure of each portion in the organic light emitting device and the electronic apparatus according to an aspect of the invention can be replaced by an arbitrary structure having the same function. Moreover, other arbitrary structures may be added to an aspect of the invention. Moreover, the invention may be configured combining two or more of arbitrary configurations (features) in the embodiments described above.

Examples

Next, specific examples of the invention are described.
1. Film Formation of First Sealing Layer
(Sample 1)

First, a p type silicon crystal substrate was prepared, and then a first sealing layer containing silicon oxynitride (SiON) was formed by an ion plating method under the conditions described below.
Film Formation Conditions
Pressure in chamber: 2.0 Pa
Process gas: $N_2$
Raw material: SiO
Discharge current value: 130 A
Gun Ar flow rate: 80 mL/min The average thickness of the obtained first sealing layer was 200 nm.
(Sample 2)

A first sealing layer was obtained in the same manner as in the sample 1, except changing the conditions when forming the first sealing layer containing silicon oxynitride by an ion plating method as follows.
Film Formation Conditions
Pressure in chamber: 1.8 Pa
Process gas: $N_2$
Raw material: SiO
Discharge current value: 130 A
Gun Ar flow rate: 80 mL/min The average thickness of the obtained first sealing layer was 200 nm.
(Sample 3)

A first sealing layer was obtained in the same manner as in the sample 1, except changing the conditions when forming the first sealing layer containing silicon oxynitride by an ion plating method as follows.
Film Formation Conditions
Pressure in chamber: 1.2 Pa
Process gas: $N_2$
Raw material: SiO
Discharge current value: 130 A
Gun Ar flow rate: 80 mL/min The average thickness of the obtained first sealing layer was 200 nm.
(Sample 4)

A first sealing layer was obtained in the same manner as in the sample 1, except changing the conditions when forming the first sealing layer containing silicon oxynitride by an ion plating method as follows.
Film Formation Conditions
Pressure in chamber: 0.8 Pa
Process gas: $N_2$
Raw material: SiO
Discharge current value: 130 A
Gun Ar flow rate: 80 mL/min The average thickness of the obtained first sealing layer was 200 nm.
(Sample 5)

A first sealing layer was obtained in the same manner as in the sample 1, except changing the conditions when forming the first sealing layer containing silicon oxynitride by an ion plating method as follows.
Film Formation Conditions
Pressure in chamber: 0.5 Pa
Process gas: $N_2$
Raw material: SiO
Discharge current value: 130 A
Gun Ar flow rate: 80 mL/min The average thickness of the obtained first sealing layer was 200 nm.
2. Manufacturing of Organic EL Device
(Device Sample 1)

According to the processes [1] to [10] of the method for manufacturing an organic EL device described above, an organic EL device of a device sample 1 was manufactured.

In the manufacturing of the device sample 1, the first sealing layer 34a was formed under the same conditions as the conditions when forming the first sealing layer of the sample 1 in the process [3] above.

(Device Sample 2)

An organic EL device of a device sample 2 was manufactured in the same manner as in the device sample 1, except forming the first sealing layer 34a under the same conditions as the conditions when forming the first sealing layer of the sample 2 in the process [3] above.

(Device Sample 3)

An organic EL device of a device sample 3 was manufactured in the same manner as in the device sample 1, except forming the first sealing layer 34a under the same conditions as the conditions when forming the first sealing layer of the sample 3 in the process [3] above.

(Device Sample 4)

An organic EL device of a device sample 4 was manufactured in the same manner as in the device sample 1, except forming the first sealing layer 34a under the same conditions as the conditions when forming the first sealing layer of the sample 4 in the process [3] above.

(Device Sample 5)

An organic EL device of a device sample 5 was manufactured in the same manner as in the device sample 1, except forming the first sealing layer 34a under the same conditions as the conditions when forming the first sealing layer of the sample 5 in the process [3] above.

3. Evaluation 3-1. Evaluation Based on Presence or Absence of Dark Spots 100 organic EL devices of each device sample No. were prepared, and then allowed to stand under high temperature and high humidity conditions of 65° C. and 90% RH for 28 hr. Then, the organic EL devices in which an initial failure occurred were rejected.

Thereafter, a reliability test was carried out under the conditions of 65° C. and 90% RH for 1000 hr, and then it was confirmed whether or not dark spots were generated in each organic EL device. Then, the number of the devices (panel) in which dark spots were generated in the organic EL devices of each device sample No. were determined.

The results are shown in Table 1.

TABLE 1

| | Film formation conditions | | | Experiment results | | |
|---|---|---|---|---|---|---|
| Sample | Film formation pressure (Pa) | Discharge current (A) | Gun Ar (mL/min) | Number of charged panels | Number of generated DS | DS generation rate |
| 1 | 2.0 | 130 | 80 | 100 | 0 | 0% |
| 2 | 1.8 | 130 | 80 | 100 | 0 | 0% |
| 3 | 1.2 | 130 | 80 | 100 | 13 | 13% |
| 4 | 0.8 | 130 | 80 | 100 | 20 | 20% |
| 5 | 0.5 | 130 | 80 | 100 | 15 | 15% |

As shown in Table 1, it was found that the dark spots were not generated in the device sample 1 and the device sample 2 but the number of the dark spots was generated in the device sample 3, the device sample 4, and the device sample 5.

As described above, the boundary for the presence or absence of the dark spots was recognized between the device sample 2 and the device sample 3. It was considered that, by forming a non-dense layer as compared with the first sealing layer of the device sample 2, the first sealing layer was able to be formed into a layer not having gas barrier properties (vapor barrier properties).

3-2. Measurement of Heavy Hydrogen Diffusion Coefficient

In the evaluation based on the presence or absence of the dark spots in the organic EL devices described above, the first sealing layers of the sample 2 and the sample 3 corresponding to the first sealing layers of the device sample 2 and the device sample 3 between which the boundary for the presence or absence of the dark spots was recognized were individually measured for the heavy hydrogen diffusion coefficient in the first sealing layers at 85° C. in a heavy hydrogen atmosphere.

The measurement of the heavy hydrogen diffusion coefficient was carried out as follows.

Measurement Method

For the calculation of the heavy water diffusion coefficient, each sample was measured for the amount of heavy hydrogen diffused into the film at 85° C. in a heavy hydrogen atmosphere using a sims device (manufactured by CAMECA, "IMS-7f"), and then the heavy hydrogen diffusion coefficient was calculated from the value. In the measurement by the SIMS, D$^-$ secondary ions were detected using a Cs$^+$ primary beam. The measurement of D– was carried out in a high mass resolution mode in order to eliminate influence of H$_2^+$ which are interfering ions.

From the heavy hydrogen diffusion coefficient to the side of the p type silicon crystal substrate in each of the first sealing layers of the samples 2 and 3 subjected to the above-described measurement, it was found that the boundary of the heavy hydrogen diffusion coefficients between the first sealing layer of the sample 2 and the first sealing layer of the sample 3 was $1 \times 10^{-21}$ (m$^2$/sec). More specifically, it can be said that, when the heavy hydrogen diffusion coefficient of the first sealing layer is $1 \times 10^{-21}$ (m$^2$/sec) or more, the first sealing layer does not have gas barrier properties (vapor barrier properties). By configuring an organic EL device to have such a first sealing layer, an organic EL device having an organic light emitting element in which a reduction in the light emission properties resulting from the generation of the dark spots is suppressed can be obtained.

4. Measurement of Infrared Absorption Spectrum

The first sealing layers of the samples 2, 3, and 5 were individually measured for the infrared absorption spectrum by a Fourier-transform infrared spectrophotometer.

The measurement conditions by a Fourier-transform infrared spectrophotometer are as follows.

Measurement Conditions

Device name: Thermo Nicolet 380

Light source: High-intensity ceramic light source (which emits infrared light by black body radiation)

Detector: MCT

Beam splitter: KBr

Resolution: 4.0 cm$^{-1}$

Prism: Diamond (refractive index=2.40)

Incident angle: 45°

Polarization: Non-Polarized

The measurement results were obtained by correcting the measurement results obtained by ATR with software attached to the device referred to as "Advanced ATR correction" (which allows comparison with transmission light measurement).

The ATR correction conditions were as follows:

Crystal (diamond) refractive index=2.40

Sample refractive index=1.50

Incident angle=45.0°

Number of times of reflection=1.0.

In the first sealing layers of the samples 2, 3, and 5, the B/A of each sample is shown in Table 2 shown below and FIG. 7.

Figure 8:
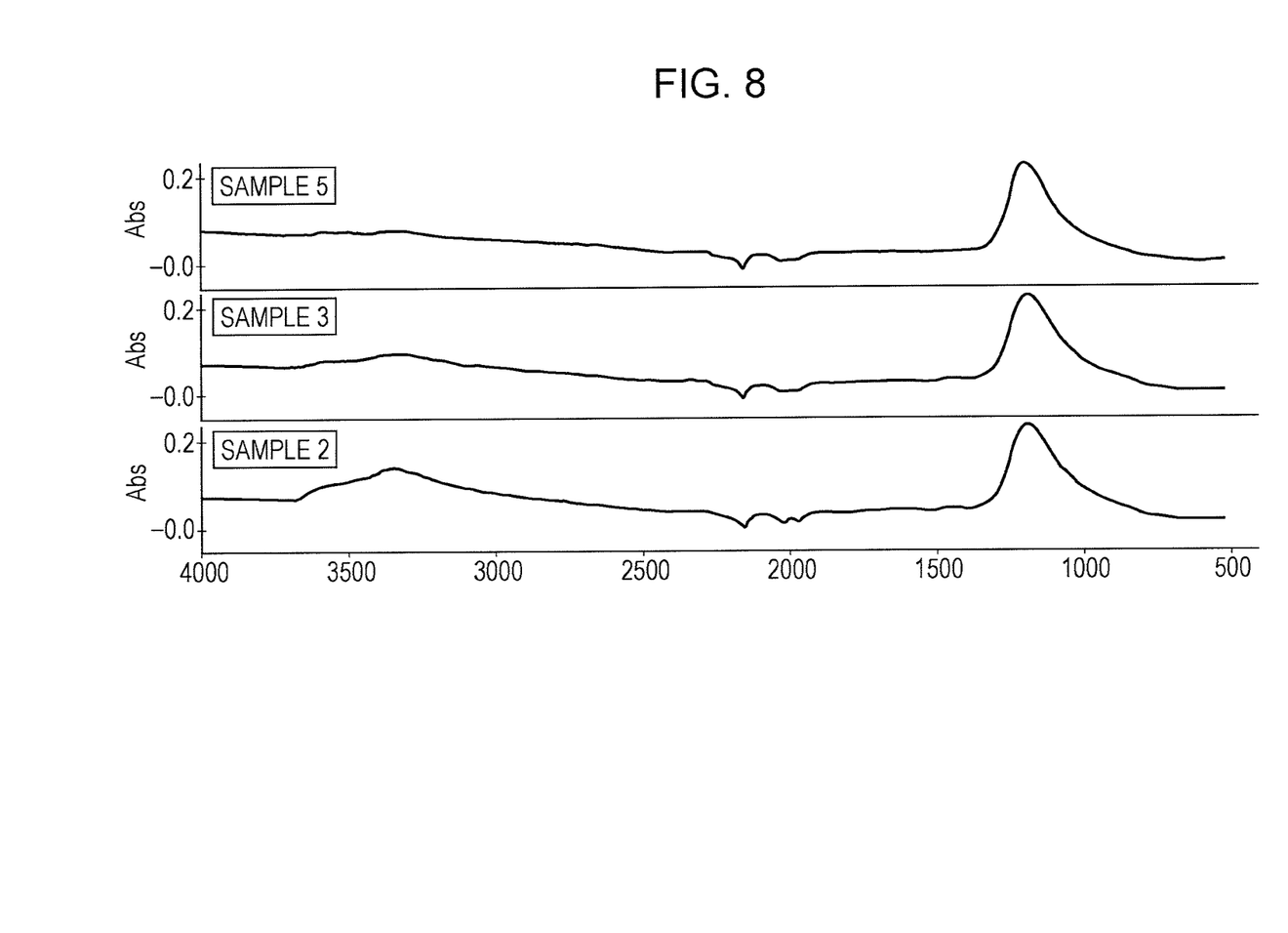
FIG. 8 shows the infrared resonance spectrum obtained in the first sealing layer of each of the samples 2, 3, and 5.

Moreover, the infrared absorption spectra obtained in the first sealing layers of the samples 2, 3, and 5 are individually shown in FIG. 8.

TABLE 2

| | Film formation conditions | | | |
|---|---|---|---|---|
| Sample | Film formation pressure (Pa) | Discharge current (A) | Gun Ar (mL/min) | FTIR B/A |
| 2 | 1.8 | 130 | 80 | 0.68 |
| 3 | 1.2 | 130 | 80 | 0.36 |
| 5 | 0.5 | 130 | 80 | 0.08 |

Figure 7:
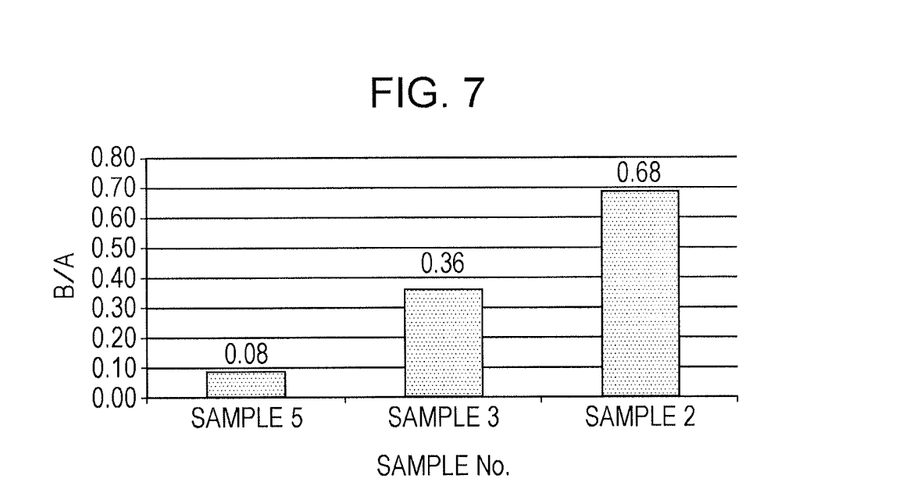
FIG. 7 is a graph showing the B/A ratio in a first sealing layer of each of samples 2, 3, and 5.

As shown in Table 2 and FIG. 7, the B/A of the first sealing layer of the sample 2 was 0.6 or more.

On the other hand, the B/A of the first sealing layer of each of the samples 3 and 5 was much lower than 0.6. This showed that the heavy water diffusion coefficient of $1 \times 10^{-21}$ (m$^2$/sec) or more was equivalent to the B/A by STIR of 0.6 or more.

The entire disclosure of Japanese Patent Application No. 2015-190229, filed Sep. 28, 2015 is expressly incorporated by reference herein.

What is claimed is:

1. An organic light emitting device comprising:
   a substrate;
   an organic light emitting element disposed on the substrate; and
   a sealing layer sealing the organic light emitting element by covering the organic light emitting element, wherein
   the sealing layer is a multilayer body in which a first sealing layer mainly containing an inorganic material, a buffer layer mainly containing a resin material, and a second sealing layer mainly containing silicon oxynitride are successively stacked from a side of the organic light emitting element, and
   the first sealing layer has a heavy hydrogen diffusion coefficient of $1.0 \times 10^{-21}$ m$^2$/sec or more at 85° C. in a heavy hydrogen atmosphere.

2. The organic light emitting device according to claim 1, wherein
   the inorganic material contains at least one kind of silicon oxynitride, silicon oxide, and silicon nitride.

3. The organic light emitting device according to claim 1, wherein
   the inorganic material is silicon oxynitride, and, when transmittance of the first sealing layer is measured by a Fourier-transform infrared spectrophotometer and a transmittance at a peak appearing around 1000 cm$^{-1}$ is set to A [%] and a transmittance at a peak appearing around 3200 cm$^{-1}$ is set to B [%], B/A is 0.6 or more.

4. The organic light emitting device according to claim 3, wherein
   the second sealing layer contains a layer in which the B/A is 0.01 or more and less than 0.5.

5. An electronic apparatus comprising:
   the organic light emitting device according to claim 1.

6. An electronic apparatus comprising:
   the organic light emitting device according to claim 2.

7. An electronic apparatus comprising:
   the organic light emitting device according to claim 3.

8. An electronic apparatus comprising:
   the organic light emitting device according to claim 4.

* * * * *